United States Patent
Katz

(10) Patent No.: US 7,554,171 B2
(45) Date of Patent: Jun. 30, 2009

(54) SEMICONDUCTOR CONSTRUCTIONS

(75) Inventor: Zachary B. Katz, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 12/013,963

(22) Filed: Jan. 14, 2008

(65) Prior Publication Data

US 2008/0128870 A1  Jun. 5, 2008

Related U.S. Application Data

(62) Division of application No. 11/389,632, filed on Mar. 24, 2006, now Pat. No. 7,345,332, which is a division of application No. 10/765,699, filed on Jan. 26, 2004, now Pat. No. 7,037,840.

(51) Int. Cl.
    H01L 29/00 (2006.01)
(52) U.S. Cl. .................. 257/506; 257/E21.304
(58) Field of Classification Search .......... 257/506, 257/E21.304
    See application file for complete search history.

(56) References Cited

U.S. PATENT DOCUMENTS

| | | |
|---|---|---|
| 5,169,491 A | 12/1992 | Doan |
| 5,618,381 A | 4/1997 | Doan et al. |
| 5,665,657 A * | 9/1997 | Lee .......................... 438/624 |
| 6,184,143 B1 | 2/2001 | Ohashi et al. |
| 6,187,662 B1 | 2/2001 | Usami et al. |
| 6,215,144 B1 | 4/2001 | Saito et al. |
| 6,225,240 B1 * | 5/2001 | You et al. .................. 438/782 |
| 6,235,620 B1 | 5/2001 | Saito et al. |
| 6,258,649 B1 | 7/2001 | Nakamura et al. |
| 6,261,883 B1 | 7/2001 | Koubuchi et al. |
| 6,399,438 B2 | 6/2002 | Saito et al. |
| 6,432,843 B1 | 8/2002 | Kim et al. |
| 6,479,405 B2 | 11/2002 | Lee et al. |
| 6,489,252 B2 | 12/2002 | Goo et al. |
| 6,596,607 B2 | 7/2003 | Ahn |
| 6,635,586 B2 | 10/2003 | Goo et al. |
| 6,649,503 B2 | 11/2003 | Kim et al. |
| 6,693,050 B1 * | 2/2004 | Cui et al. .................. 438/782 |
| 2001/0012687 A1 | 8/2001 | Xu et al. |
| 2003/0013387 A1 | 1/2003 | Tsai et al. |
| 2003/0062599 A1 * | 4/2003 | Egami et al. ................ 257/632 |
| 2004/0106292 A1 * | 6/2004 | Sato et al. .................. 438/689 |
| 2004/0222740 A1 * | 11/2004 | Kim .......................... 313/506 |
| 2004/0224496 A1 * | 11/2004 | Cui et al. .................. 438/626 |
| 2004/0263711 A1 * | 12/2004 | Matsumoto et al. .......... 349/44 |
| 2005/0037529 A1 * | 2/2005 | Nagao et al. ................ 438/30 |
| 2005/0087772 A1 * | 4/2005 | Yamazaki .................. 257/213 |
| 2005/0266650 A1 | 12/2005 | Ahn et al. |

* cited by examiner

*Primary Examiner*—Thao P. Le
(74) *Attorney, Agent, or Firm*—Wells St. John P.S.

(57) ABSTRACT

The invention includes a method of forming a planarized surface over a semiconductor substrate. A substrate is provided which includes a memory array region and a peripheral region proximate the memory array region. The memory array region has a higher average elevational height than the peripheral region. Polysilazane is formed over the memory array region and over the peripheral region. The polysilazane is densified. A material is formed over the polysilazane. The material is planarized while using the densified polysilazane as a stop. The planarization forms a planarized surface which extends over the memory array and peripheral regions. The planarized surface comprises both the densified polysilazane and the material.

10 Claims, 3 Drawing Sheets

US 7,554,171 B2

SEMICONDUCTOR CONSTRUCTIONS

RELATED PATENT DATA

This patent resulted from a divisional application of U.S. patent application Ser. No. 11/389,632, which was filed Mar. 24, 2006 now U.S. Pat. No. 7,345,332, which is hereby incorporated by reference; which is divisional application of U.S. patent application Ser. No. 10/765,699, which was filed Jan. 26, 2004, which issued as U.S. Pat. No. 7,037,840, and which is hereby incorporated by reference.

TECHNICAL FIELD

The invention pertains to methods of forming planarized surfaces over semiconductor substrates.

BACKGROUND OF THE INVENTION

Numerous applications exist in semiconductor processing in which it is desired to form planarized surfaces over uneven topography. The planarized surfaces will typically not be absolutely planar in a mathematical sense, but rather will be approximately planar in that there can be minor variations across the surfaces which cause the surfaces to deviate from absolute planarity. Such minor variations can include, for example, dishing, which is a common occurrence if chemical-mechanical polishing (CMP) is utilized for the planarization of a surface. The term "substantially planar" is utilized herein to indicate that a surface has only minor variations from absolute planarity, with typical minor variations being within about +/−5% from absolute planarity.

One method for forming a planarized surface is as follows. Initially, a single material is deposited over a non-planar topography. The material is deposited to a sufficient thickness so that the material completely covers and fills the non-planar topography of the substrate. An upper surface of the material will typically be non-planar as-deposited, in that the material will deposit over the non-planar topography of the substrate with some conformality. The material is subsequently planarized with an appropriate process, such as, for example, chemical-mechanical polishing (CMP) to substantially planarize the upper surface of the material.

A problem with planarization of a single material is that it is difficult to ascertain an appropriate stop point within the material. For instance, if CMP is utilized, a rate of removal of the material by the CMP can be estimated, and the CMP can then be timed in an attempt to remove a desired thickness of the material. However, minor variations in temperature, type of slurry, polishing pad wear, etc. can impact the rate of removal of material by CMP. Accordingly, the rate of removal of the material by the CMP can vary as the various components utilized in the polishing process age, and/or if temperature varies. This can make it difficult to control CMP processes within the tight tolerances desired for modern semiconductor device processing.

If the CMP process is not appropriately maintained within desired tolerances, there can be a non-uniform thickness of material across the substrate after the CMP, which can create difficulties in fabrication steps following the CMP.

It is desired to develop new methods for forming planarized surfaces over semiconductor substrates to alleviate the problems discussed above.

SUMMARY OF THE INVENTION

In one aspect, the invention encompasses an observation that a spin-on-dielectric (SOD) can typically be deposited with better uniformity than a timed CMP process can achieve. In such aspect, the invention encompasses methods for improving post-CMP thickness uniformity across a semiconductor wafer by utilizing an SOD as a polish stop.

In one aspect, the invention encompasses a method of forming an electrically insulative surface over a semiconductor substrate. A substrate is initially provided to have a substantially non-planar surface topography. A SOD material is formed over the substantially non-planar surface topography of the substrate. A second dielectric material is formed over the SOD material. The second material is polished while using the SOD material as a polishing stop. The polishing utilizes conditions which remove the second dielectric material at a faster rate than the SOD material. The polishing forms an electrically insulative surface over the semiconductor substrate, with such surface comprising both the SOD material and the second dielectric material.

In one aspect, the invention encompasses a method of forming a planarized surface over a memory array region and a peripheral region of a semiconductor substrate. The memory array region has a different average elevational height than the peripheral region. Polysilazane is formed over the memory array region and over the peripheral region. At least a portion of the polysilazane is densified. A material is formed over the polysilazane. The material has a different average elevational height over the memory array region than over the peripheral region. The material is planarized under conditions which remove the material at a faster rate than the densified polysilazane. The planarizing forms a planarized surface which comprises the polysilazane and the material, and which extends over the memory array and peripheral regions.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
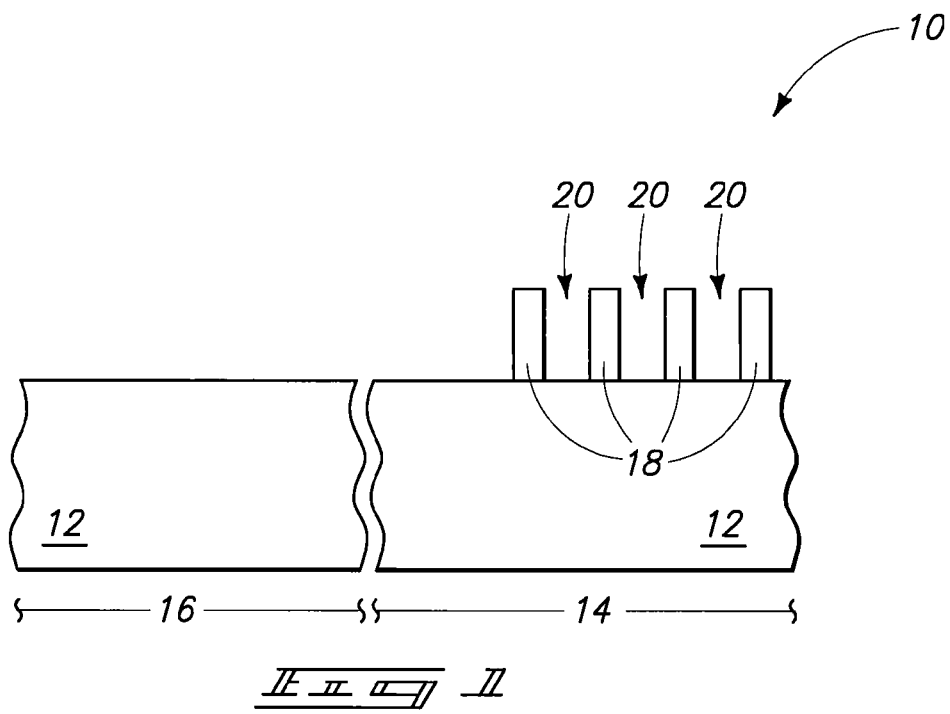
FIG. 1 is a diagrammatic, cross-sectional view of a semiconductor wafer fragment at a preliminary processing stage of an exemplary aspect of the present invention.

An exemplary aspect of the invention is described with reference to FIGS. 1-3. Referring initially to FIG. 1, a fragment 10 of a semiconductor wafer is illustrated at a preliminary processing stage. Fragment 10 comprises a base 12 which can comprise, consist essentially of, or consist of monocrystalline silicon lightly-doped with background p-type dopant.

To aid in interpretation of the claims that follow, the terms "semiconductive substrate" and "semiconductor substrate"

are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In accordance with such definition of "substrate", the structure 12 can itself be a substrate, or the combination of structure 12 with various other structures can be a substrate.

Base 12 is divided into a pair of regions 14 and 16. A plurality of structures 18 are shown formed over region 14 and not over region 16. The shown structures 18 are separated from one another by gaps 20. The structures 18 and base 12 can be together considered a semiconductor substrate in some aspects of the invention. Such semiconductor substrate has a substantially non-planar surface topography. Specifically, features 18 correspond to projections of the substrate separated by gaps 20, and accordingly correspond to non-planar regions of the substrate.

The structures 18 increase an average elevational height of the semiconductor substrate within region 14 relative to an average elevational height of the substrate within region 16. Structures 18 can have elevational heights of greater than or equal to about 1000 Å, with a typical height being from about 1000 Å to about 3000 Å. The difference in the average elevational height associated with region 14 relative to the average elevational height associated with region 16 can thus be greater than 1000 Å, and in some aspects of the invention can be from about 1000 Å to about 3000 Å.

Structures 18 are diagrammatic representations of features associated with semiconductor substrate 12. The structures 18 can comprise any suitable material or combination of materials, and can comprise any suitable shapes. In particular aspects of the invention, region 14 is a memory array region of a semiconductor substrate, and accordingly structures 18 can correspond to features associate with a memory array. For instance, structures 18 can correspond to capacitor structures and/or transistor structures associated with a dynamic random access memory (DRAM) array.

Region 16 is peripheral to the memory array and can comprise various logic circuit elements (not shown) and/or other integrated circuit devices. It is to be understood that regions 14 and 16 can be reversed. Accordingly, the memory array region can have an average elevational height associated therewith which is less than the average elevational height associated with the peripheral region, or vice versa.

Although base 12 is shown as a single homogeneous composition, it is to be understood that base 12 can comprise numerous layers of integrated circuitry at various processing stages, and that the methodology of the invention can be utilized at any suitable processing stage. Accordingly, methodology of the present invention can be utilized at a processing stage in which base 12 corresponds to a single homogeneous composition of bulk semiconductor material, and/or can be utilized at one or more processing stages in which base 12 comprises multiple layers of integrated circuitry. Also, although all of the structures 18 are shown having the same height as one another and the same general shape as one another, it is to be understood that the structures 18 can differ in height and/or shape relative to each other, and can also differ in composition relative to each other.

Figure 2:
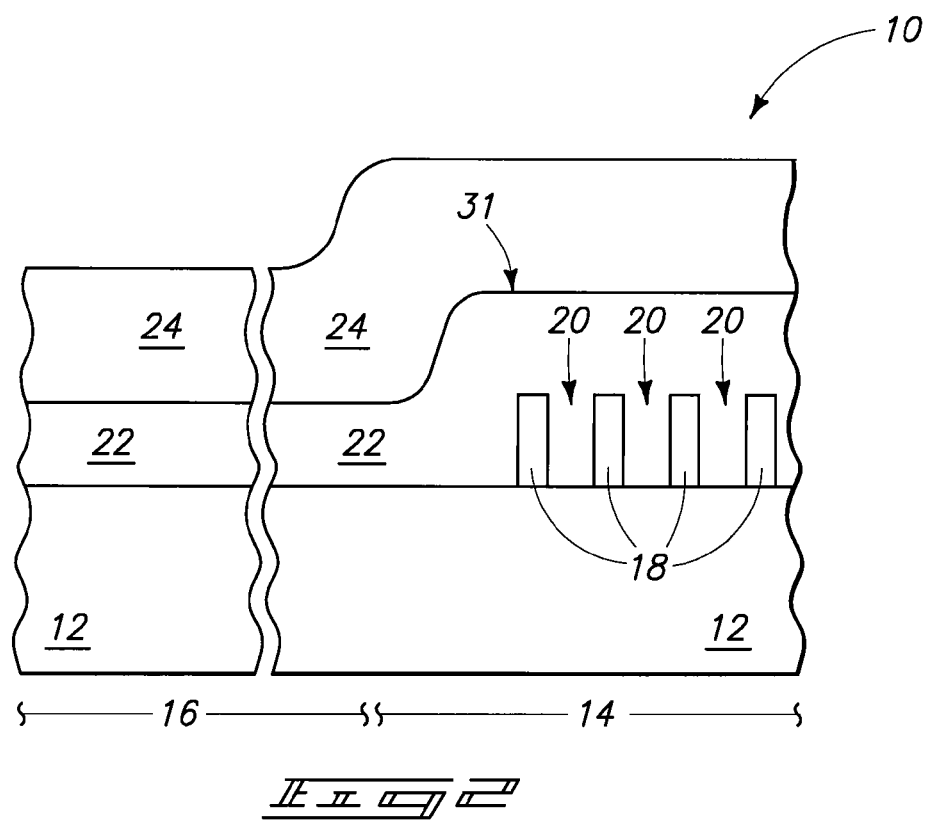
FIG. 2 is a view of the FIG. 1 wafer fragment shown at a processing stage subsequent to that of FIG. 1.

Referring to FIG. 2, a spin-on-dielectric (SOD) 22 is formed over regions 14 and 16 of the semiconductor substrate comprising base 12 and structures 18. The SOD is somewhat conformal to the non-planar surface of the substrate, and accordingly has a greater average elevational height over region 14 of the substrate than over region 16 of the substrate.

The SOD can comprise any suitable material, and in particular aspects will comprise, consist essentially of, or consist of silicon, nitrogen and hydrogen. For instance, the SOD can comprise, consist essentially of, or consist of polysilazane. If polysilazane is used, such can be densified after it is spun over the substrate. The densification converts the polysilazane partially or fully into a silicon dioxide. The densification can comprise steam densification at a temperature of from about 350° C. to about 1000° C., with about 600° C. being typical. The densification time can be from about 15 minutes to about 2 hours, with about 30 minutes being typical. The densification will proceed from the top of SOD material 22 to the bottom of the material. The densification can be conducted to proceed entirely through the SOD layer, or can be conducted to treat only the upper portion of the layer. In particular aspects, the SOD layer 22 will have an average thickness, and the treatment will be conducted so that only the upper 50% of the average thickness is treated, in other aspects only the upper 75% of the average thickness is treated, and in yet other aspects the entirety of the thickness is treated with the densification process.

The thickness of the SOD material 22 is preferably such that the material is thicker than the tallest feature 18 is high. Accordingly, if features 18 extend to a height of 3000 Å, the SOD layer will be formed to a thickness greater than 3000 Å.

A second material 24 is formed over SOD material 22. Second material 24 can have a thickness greater than or equal to the thickness of SOD material 22, and accordingly in particular aspects of the invention will have a thickness exceeding 3000 Å. Second material 24 can be a dielectric material (i.e., an electrically insulative material), and in particular aspects will comprise, consist essentially of, or consist of doped silicon oxide, with an exemplary suitable doped silicon oxide being borophosphosilicate glass (BPSG). The second material 24 has a non-planar surface topography, in that the second material is formed substantially conformally over SOD material 22. The second dielectric material 24 thus has a different average elevational height over the region 14 than over the region 16. Second material 24 can be formed by any suitable method, including, for example, chemical vapor deposition.

The above-described densification of SOD material 22 can occur before, after or during formation of the second material 24.

Figure 3:
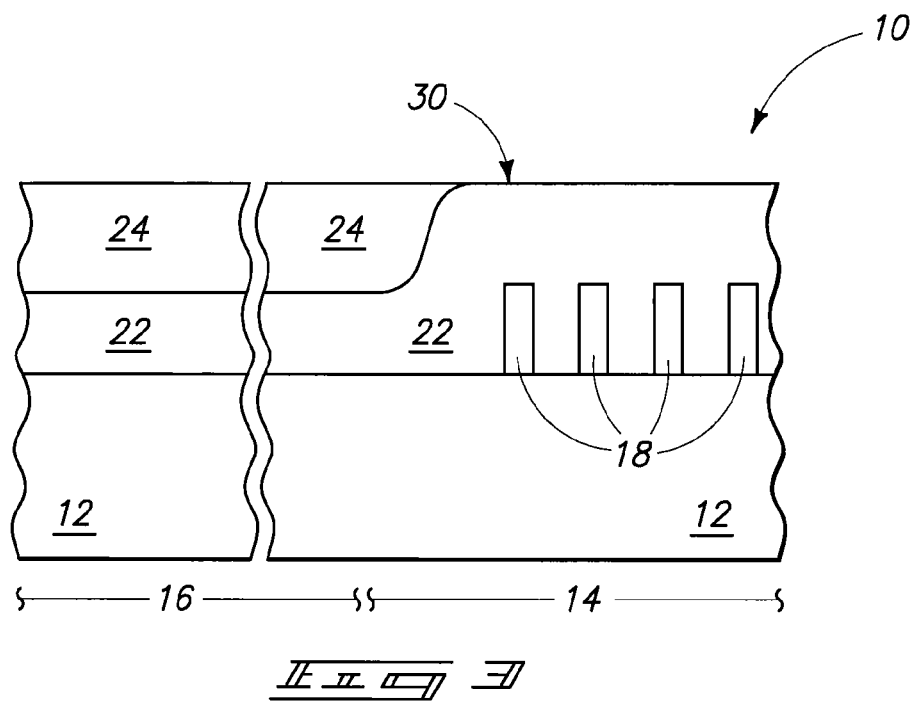
FIG. 3 is a view of the FIG. 1 wafer fragment shown at a processing stage subsequent to that of FIG. 2.

Referring to FIG. 3, material 24 is planarized while using material 22 as a stop. The planarization can remove some of material 22 while removing material 24, but removes material 24 at a faster rate than the material 22 so that the planarizing slows down upon reaching material 22. The planarization can be accomplished utilizing, for example, chemical-mechanical polishing, and accordingly material 22 can be considered a polishing stop. The term "polishing stop" is utilized to indicate that the polishing slows upon reaching material 22, which includes, but is not limited to, applications in which the polishing comes to a complete stop upon reaching material 22. Typically, the polishing process will not come to a complete stop upon reaching material 22, but will slow substantially. In some aspects, material 24 can be considered "softer" than material 22 under particular polishing conditions in that material 24 is removed more rapidly than material 22 during the polishing.

If material 24 comprises, consists essentially of, or consists of BPSG and material 22 comprises, consists essentially of, or consists of one or both of polysilazane and silicon dioxide formed from exposure of polysilazane to densification conditions, a suitable polishing process for removing material 24 relative to material 22 is a CMP process. The CMP process can utilize a polishing pad pressure of greater than 0 psi and less than or equal to about 10 psi, an uncontrolled temperature (which will typically be about room temperature), and a slurry composition comprising cerium oxide and a surfactant. The cerium oxide can be present to a concentration of from about 0.2% to about 1.5%, by weight. A suitable polishing pad is a pad comprising polyurethane. A suitable pad hardness is from about 45 Shore D to about 60 Shore D. The pad hardness can impact the extent to which dishing occurs. Specifically, if a pad is suitably hard, dishing can be substantially avoided.

FIG. 3 shows that the polishing forms a surface 30 which extends across materials 22 and 24, and which is substantially planar. Surface 30 can, in particular aspects, have a bit of dishing occurring over material 24 due to the polishing of material 24 being somewhat faster than the polishing of material 22. Surface 30 has a portion over region 16 which primarily comprises material 24, and another portion over region 14 which primarily comprises material 22. Typically, materials 22 and 24 will both be electrically insulative materials, and accordingly surface 30 will be an electrically insulative surface.

As was indicated above, the structures 18 associated with region 14 can be memory device structures, and accordingly region 14 can correspond to a memory array. Region 16 can thus correspond to a portion of the substrate peripheral to the memory array. As was also mentioned above, the memory array region and peripheral region can be reversed such that the structures are associated with a peripheral region 14 and the memory array region is associated with the relatively flat portion 16 at the processing stage of FIGS. 1-3. Typically, however, the memory array region will have the relatively non-planar features 18 associated therewith (i.e., the region 14 will correspond to the memory region), and the region peripheral to the memory array region will have much smaller structures associated therewith (and accordingly the region 16 will correspond to the region peripheral to the memory array region).

FIGS. 1-3 illustrate one aspect of the invention. Another aspect is described with reference to FIGS. 4 and 5. In referring to FIGS. 4 and 5, identical numbering will be used as was used above in describing FIGS. 1-3, where appropriate.

Figure 4:
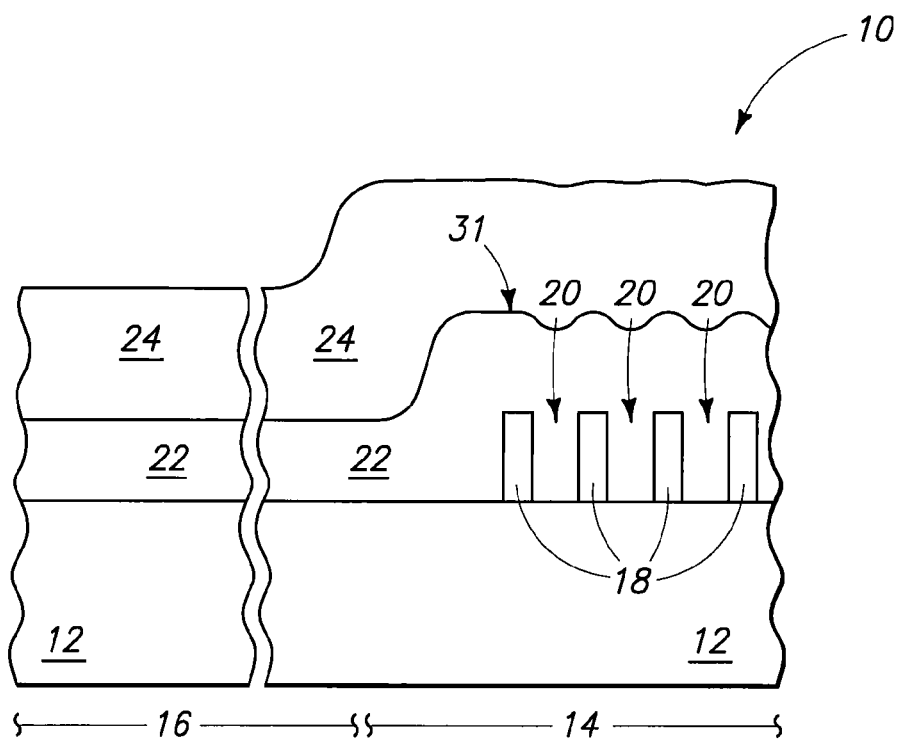
FIG. 4 is a view of the FIG. 1 wafer fragment shown at a processing stage subsequent to that of FIG. 1 in accordance with an aspect of the invention alternative to that of FIG. 2.

FIG. 4 shows the fragment 10 at a processing stage subsequent to that of FIG. 1, and specifically shows the SOD material 22 and second material 24 formed over a substrate comprising base 12 and features 18. A difference between the structure of FIG. 4 and that of FIG. 1 is that the SOD material 22 has flowed conformally into the gaps 20 between structures 18 to form a wavy surface 31 over region 14. Wavy surface 31 can result if gaps 20 have a relatively low critical dimension, and the structure of FIG. 2 can result if the gaps 20 have a higher critical dimension.

Figure 5:
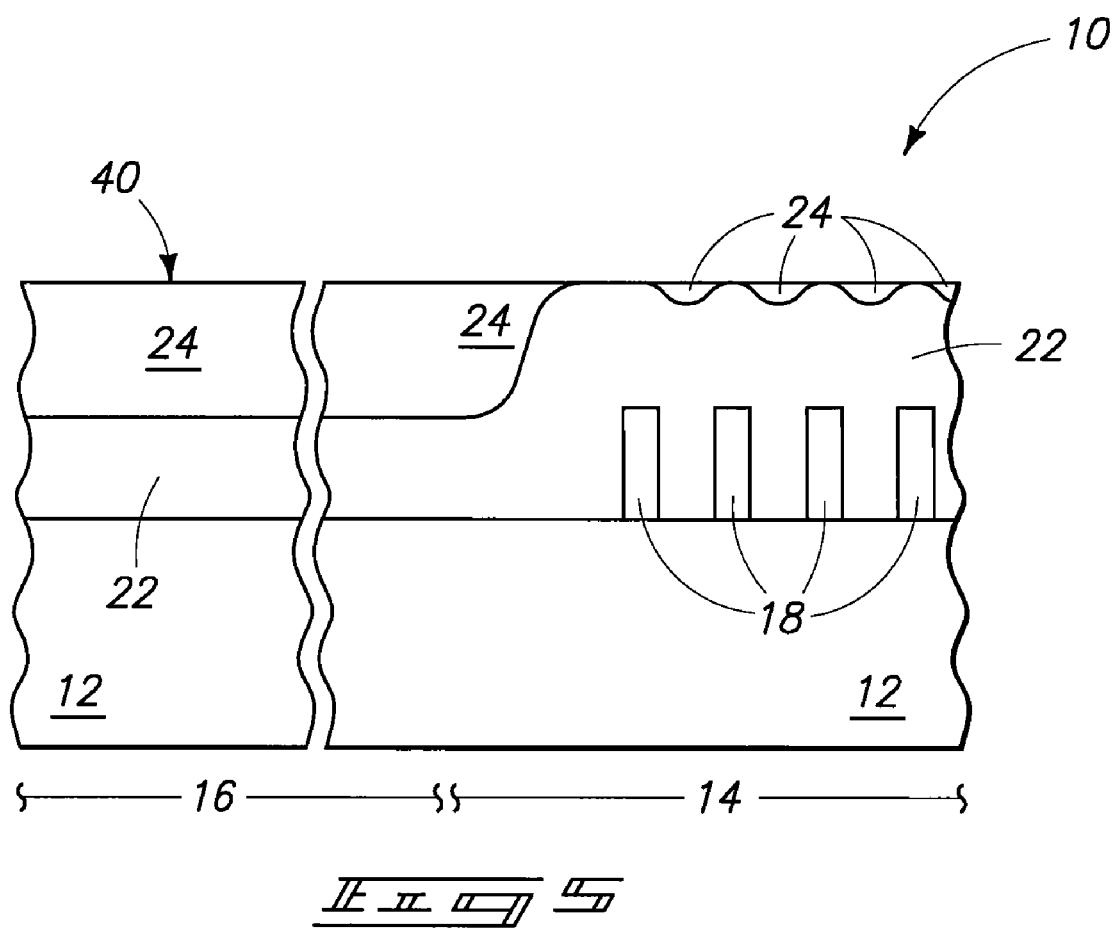
FIG. 5 is a view of the FIG. 1 wafer fragment shown at a processing stage subsequent to that of FIG. 4.

Referring to FIG. 5, material 24 is planarized to form a substantially planar upper surface 40. A difference between the upper surface 40 of FIG. 5 and the substantially planar upper surface 30 of FIG. 3 is that the upper surface 40 comprises several domains of material 24 over region 14, whereas the upper surface 30 consisted only of material 22 over the structures 18 and gaps 20 (FIGS. 2 and 4) associated with the region 14.

Either of the structures of FIG. 3 or FIG. 5 can be suitable for semiconductor applications. Specifically, the structures of FIGS. 3 and 5 have substantially planar surfaces 30 and 40 which can be subsequently utilized as base surfaces for forming additional layers of circuitry over the underlying substrate comprising structures 12 and 18.

An advantage of the present invention relative to prior art processes is that the invention can enable accurate control of the thickness of material remaining over region 14 after a polishing process. Specifically, the polishing process has a defined endpoint corresponding to the surface of material 22. A CMP processed can be monitored by any of numerous methods (including, for example, monitoring the friction of a CMP process, optically monitoring the residue generated during a CMP process, etc.) to determine when such endpoint has been reached. In prior art processes in which the polishing time was utilized to determine the thickness of a remaining material, a parameter of the CMP stage was utilized alone to control the thickness of the remaining material (specifically, the duration of the CMP process). In contrast, the present invention utilizes one or more parameters of the deposition stage utilized for formation of SOD 22 (specifically, parameters utilized to fix the thickness of material 22) to control the thickness of material remaining after the CMP process. The present invention can thus allow tighter tolerances to be obtained relative to the thickness of the material remaining after a polishing process than can be obtained utilizing prior art processes.

Processing of the present invention can improve numerous facets of fabrication processes. For instance, if a dry etch is utilized to form contact openings through either planarized surface 30 (FIG. 3) or planarized surface 40 (FIG. 5) the etch depth will be consistent from lot to lot relative to prior art processes, from wafer to wafer, and from die to die, which can improve electrical properties of functional semiconductor assemblies because the uniformity from one assembly to another will be more consistent. This can also improve the yield of semiconductor fabrication processes utilizing the present invention relative to prior art processes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
   a substrate having a non-planar surface topography; and
   an electrically insulative mass over the substrate; the electrically insulative mass comprising spin-on dielectric material having an upper surface with a non-planar surface topography and the electrically insulative mass comprising one or more other dielectric materials over at least a portion of the spin-on dielectric material that are compositionally different from the spin-on dielectric material, the electrically insulative mass having a substantially planar upper surface comprising both the spin-on dielectric material and at least one of the one or more other dielectric materials.

2. The construction of claim 1 wherein the spin-on-dielectric comprises silicon, nitrogen and hydrogen.

3. The construction of claim 1 wherein the spin-on-dielectric consists essentially of silicon, nitrogen and hydrogen.

4. The construction of claim 1 wherein the spin-on-dielectric comprises polysilazane.

5. The construction of claim 4 wherein the one or more other dielectric materials is a single material comprising a doped silicon oxide.

6. The construction of claim 4 wherein the one or more other dielectric materials is a single material consisting of borophosphosilicate glass.

7. The construction of claim 1 wherein the spin-on-dielectric consists essentially of polysilazane.

8. The construction of claim 1 wherein the spin-on-dielectric consists of polysilazane.

9. A semiconductor construction, comprising:

a substrate having a non-planar surface topography;

an electrically insulative mass over the substrate; the electrically insulative mass comprising spin-on dielectric material having an upper surface with a non-planar surface topography and the electrically insulative mass comprising one or more other dielectric materials over at least a portion of the spin-on dielectric material that are compositionally different from the spin-on dielectric material, the electrically insulative mass having a substantially planar upper surface comprising both the spin-on dielectric material and at least one of the one or more other dielectric materials; and wherein the spin-on dielectric comprises densified polysilazane.

10. A semiconductor construction, comprising:

a substrate having a non-planar surface topography;

an electrically insulative mass over the substrate; the electrically insulative mass comprising spin-on dielectric material having an upper surface with a non-planar surface topography and the electrically insulative mass comprising one or more other dielectric materials over at least a portion of the spin-on dielectric material that are compositionally different from the spin-on dielectric material, the electrically insulative mass having a substantially planar upper surface comprising both the spin-on dielectric material and at least one of the one or more other dielectric materials; and wherein the spin-on dielectric material comprises densified polysilazane and non-densified polysilazane.

* * * * *